United States Patent
Du et al.

(10) Patent No.: US 11,314,911 B1
(45) Date of Patent: Apr. 26, 2022

(54) HIGH-LEVEL SYNTHESIS IMPLEMENTATION OF DATA STRUCTURES IN HARDWARE

(71) Applicant: Xilinx, Inc., San Jose, CA (US)

(72) Inventors: Fangqing Du, San Jose, CA (US); Sheng Wang, Wuhan (CN); Alain Darte, Lyons (FR); Alexandre Isoard, San Jose, CA (US); Hem C. Neema, San Jose, CA (US); Lin-Ya Yu, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 17/331,835

(22) Filed: May 27, 2021

(51) Int. Cl.
*G06F 30/327* (2020.01)
*G06F 30/337* (2020.01)

(52) U.S. Cl.
CPC .......... *G06F 30/327* (2020.01); *G06F 30/337* (2020.01)

(58) Field of Classification Search
None
See application file for complete search history.

(56) References Cited

U.S. PATENT DOCUMENTS

| | | | |
|---|---|---|---|
| 5,907,248 A | 5/1999 | Bauer | |
| 6,298,472 B1 | 10/2001 | Phillips | |
| 7,853,914 B1 | 12/2010 | Srinivasan | |
| 8,539,463 B2 * | 9/2013 | De | G06F 9/4552 717/146 |
| 10,108,769 B1 | 10/2018 | Li et al. | |
| 10,586,003 B1 | 3/2020 | Suresh | |
| 11,062,066 B2 * | 7/2021 | Tamiya | G06F 30/327 |
| 11,163,546 B2 * | 11/2021 | Rong | G06F 8/10 |
| 2006/0288337 A1 | 12/2006 | Nishi | |
| 2007/0150846 A1 | 6/2007 | Furnish | |
| 2008/0216038 A1 | 9/2008 | Bose | |
| 2009/0254874 A1 | 10/2009 | Bose | |
| 2016/0299998 A1 | 10/2016 | Isshiki | |
| 2019/0205487 A1 | 7/2019 | Tamiya | |

OTHER PUBLICATIONS

D. Richmond et al., "Tinker: Generating Custom Memory Architectures for Altera's OpenCL Compiler," 2016 IEEE 24th Int'l Symposium on Field-Programmable Custom Computing Machines, IEEE Computer Society, pp. 21-24. (Year: 2016).*

(Continued)

*Primary Examiner* — Leigh M Garbowski
(74) *Attorney, Agent, or Firm* — Kevin T. Cuenot

(57) ABSTRACT

High-level synthesis implementation of data structures in hardware can include detecting, within a design and using computer hardware, a data structure and a compiler directive for the data structure. The design may be specified in a high-level programming language. Using the computer hardware and based on the compiler directive, a modified version of the design may be created by, at least in part, generating a modified version of the data structure based on the compiler directive. Using the computer hardware, a circuit design may be generated from the modified version of the design by creating, at least in part, a hardware memory architecture for the circuit design and mapping the modified version of the data structure onto the hardware memory architecture.

20 Claims, 6 Drawing Sheets

(56) References Cited

OTHER PUBLICATIONS

Chevobbe et al., "Reducing Reconfigurable Overheads in Heterogeneous Multicore RSoCs with Predictive Configuration Management", Hindawi Publishing Corporation, International Journal of Reconfigurable Computing, vol. 2009, 2009, Article ID 290167, 7 pages. (Year: 2009).
Picard et al., "Multilevel Simulation of Heterogeneous Reconfigurable Platforms", Hindawi Publishing Corporation, International Journal of Reconfigurable Computing, vol. 2009, 2009, Article ID 162416, 12 pages. (Year: 2009).
Pohl etal., "vMAGIC—Automatic Code Generation forVHDL", Hindawi Publishing Corporation, International Journal of Reconfigurable Computing, vol. 2009, 2009, Article ID 205149, 9 pages. (Year: 2009).
Quadri et al. "High level modeling of Dynamic Reconfigurable FPGAs", Hindawi Publishing Corporation, International Journal of Reconfigurable Computing, vol. 2009, 2009, Article ID 408605, 15 pages. (Year: 2009).

\* cited by examiner

HIGH-LEVEL SYNTHESIS IMPLEMENTATION OF DATA STRUCTURES IN HARDWARE

RESERVATION OF RIGHTS IN COPYRIGHTED MATERIAL

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

This disclosure relates to integrated circuits (ICs) and, more particularly, to implementing data structures in hardware using high-level synthesis.

BACKGROUND

High-Level Synthesis (HLS) refers to a computer-based process in which a description of behavior for a system is converted into a hardware implementation, e.g., a circuit design, that implements the described behavior. In the context of HLS, the behavioral description is specified in source code as a high-level programming language. Examples of high-level programming languages include, but are not limited to, C and C++. The circuit design may be a register transfer level (RTL) design specified in a hardware description language. Further processing such as synthesis, placement, and routing may be performed on the circuit design to realize a physical implementation of the circuit design in circuitry of a target integrated circuit.

SUMMARY

In one or more example implementations, a method can include detecting, within a design and using computer hardware, a data structure and a compiler directive for the data structure. The design may be specified in a high-level programming language. The method can include creating, using the computer hardware and based on the compiler directive, a modified version of the design by, at least in part, generating a modified version of the data structure based on the compiler directive. The method also can include generating, using the computer hardware, a circuit design from the modified version of the design by creating, at least in part, a hardware memory architecture for the circuit design and mapping the modified version of the data structure onto the hardware memory architecture.

In one or more example implementations, a system includes a processor configured to initiate operations. The operations can include detecting, within a design, a data structure and a compiler directive for the data structure. The design may be specified in a high-level programming language. The operations can include creating, based on the compiler directive, a modified version of the design by, at least in part, generating a modified version of the data structure based on the compiler directive. The operations also can include generating a circuit design from the modified version of the design by creating, at least in part, a hardware memory architecture for the circuit design and mapping the modified version of the data structure onto the hardware memory architecture.

In one or more example implementations, a computer program product includes one or more computer readable storage media, and program instructions collectively stored on the one or more computer readable storage media. The program instructions are executable by computer hardware to initiate operations. The operations can include detecting, within a design, a data structure and a compiler directive for the data structure. The design may be specified in a high-level programming language. The operations can include creating, based on the compiler directive, a modified version of the design by, at least in part, generating a modified version of the data structure based on the compiler directive. The operations also can include generating a circuit design from the modified version of the design by creating, at least in part, a hardware memory architecture for the circuit design and mapping the modified version of the data structure onto the hardware memory architecture.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

This disclosure relates to integrated circuits (ICs) and, more particularly, to implementing data structures in hardware using high-level synthesis (HLS). In accordance with the inventive arrangements described within this disclosure, methods, systems, and computer program products for HLS are provided that are capable of implementing a data structure as a hardware memory architecture. In example implementations, a design to be implemented in circuitry includes a data structure and compiler directive corresponding to the data structure. The design, including the data structure, is specified in a high-level programming language. An HLS system is capable of transforming the design into a circuit design specified in, or using, a hardware description language. The circuit design defines a hardware implementation of the design that includes a hardware memory architecture that implements the data structure in accordance with the compiler directive.

In an example, as part of implementing the design, the HLS system is capable of modifying the data structure in accordance with the corresponding compiler directive included in the design. The compiler directive can specify particular operations to be performed by the HLS system. In executing the compiler directive, for example, the HLS system processes the data structure, which may have a first data model organization, to generate a modified version of the data structure. The modified version of the data structure may have a second and different data model organization. The modified version of the data structure generally corresponds to, or specifies, a particular hardware memory architecture. For example, the resulting modified version of the data structure corresponds to a particular hardware memory architecture to be implemented in circuitry as intended by the designer (e.g., the user).

The modified version of the data structure may be part of a modified version of the design also generated by the HLS system. The HLS system is capable of generating a circuit design from the modified version of the design. The circuit design includes the hardware memory architecture corresponding to the modified version of the data structure. As part of generating the circuit design, the modified version of the data structure may be mapped onto the hardware memory architecture of the circuit design.

Figure 1:
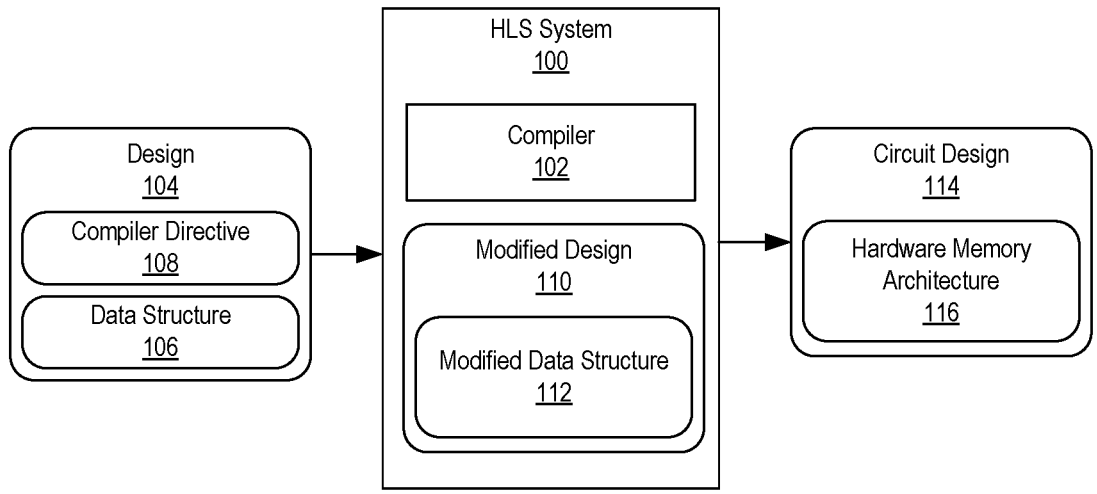
FIG. 1 illustrates an example of a High-Level Synthesis (HLS) system.

FIG. 1 illustrates an example HLS system 100. HLS system 100 may be implemented as a data processing system, e.g., a computer, that executes suitable HLS software. The HLS software may include a compiler 102 that is capable of performing the various operations described herein. An example implementation of HLS system 100 is described in greater detail in connection with FIG. 8.

In the example of FIG. 1, compiler 102 receives design 104 for processing. Compiler 102 is capable of transforming design 104 into circuit design 114. Design 104 is specified as one or more source code files. The source code may be specified in a high-level programming language. For example, design 104 may be specified in C or C++. Design 104 defines a behavioral description to be implemented as circuitry in a target integrated circuit (IC). Design 104 includes a data structure 106 and a compiler directive 108. Compiler directive 108 is associated with data structure 106 in that compiler directive 108 specifies one or more instructions to be followed by compiler 102 for processing data structure 106.

As defined herein, the term "compiler," as part of an HLS system, means an executable computer program that is capable of translating source code specified in a high-level programming language into a circuit design specified using a hardware description language.

As defined herein, the term "source code" means a listing of commands specified in human readable format to be compiled into a different form such as executable program code or a circuit design. The commands may be specified using a high-level programming language.

As defined herein, the term "high-level programming language" means a set of instructions used to program a data processing system where the instructions have a strong abstraction from the details of the data processing system, e.g., machine language. For example, a high-level programming language may automate or hide aspects of operation of the data processing system such as memory management. The amount of abstraction typically defines how "high-level" the programming language is. Using a high-level programming language frees the user from dealing with registers, memory addresses, and other low-level features of the data processing system upon which the high-level programming language will execute. In this regard, a high-level programming language may include little or no instructions that translate directly, on a one-to-one basis, into a native opcode of a central processing unit (CPU) of a data processing system. Examples of high-level programming languages include, but are not limited to, C, C++, SystemC, OpenCL C, or the like.

As defined within this disclosure, the term "compiler directive" means an instruction that is included in source code that is followed by a compiler as part of a process (e.g., compilation) of transforming the source code into another target format such as an executable or a circuit design. In following the compiler directive, for example, the compiler generates a particular implementation of the target format having one or more features or attributes that the target format would not possess without inclusion of the compiler directive in the source code being compiled.

In the example of FIG. 1, design 104 includes one data structure and corresponding directive for purposes of illustration. It should be appreciated that design 104 may include additional data structures and corresponding directives as described within this disclosure. Different ones of the data structures may be processed differently based on the particular compiler directive corresponding to each respective data structure.

Compiler 102 is capable of generating a modified version of design 104 shown as "modified design" 110 in FIG. 1. Within this disclosure, the terms "modified version of design" and "modified design" are used interchangeably. In an aspect, modified design 110 may be specified as an intermediate representation. Modified design 110 includes a modified version of data structure 106 shown as "modified data structure 112." Within this disclosure, the terms "modified version of data structure" and "modified data structure" are used interchangeably. Compiler 102 generates modified design 110 and further generates modified data structure 112, at least in part, by following or executing, compiler directive 108. Compiler directive 108 may specify one or more operations to be performed by compiler 102 to generate modified data structure 112 from data structure 106.

As defined within this disclosure, the term "intermediate representation" is code, specified as a data structure, used internally by a compiler to represent source code. A compiler translates source code into an intermediate representation to perform further operations on the source code. An intermediate representation is designed to be conducive to further processing, such as optimization of source code and further translation of the source code into an executable or a circuit design. An intermediate representation is an accurate representation of the source code that is capable of representing the source code without loss of information and is independent of any particular source or target language. In some cases, the intermediate representation may use a static single assignment (SSA) compliant form. Examples of intermediate representations include, but are not limited to, stack machine code, two address code, three address code, and/or a graph data structure. Other examples of intermediate representations may include, but are not limited to Low Level Virtual Machine (LLVM) intermediate representation and GNU Compiler Collection (GCC) intermediate representation.

Compiler 102 is further capable of generating circuit design 114 from modified circuit design 110. Circuit design 114 may be specified using a hardware description language. In one aspect, circuit design 114 is independent of a particular target IC. Further operations performed as part of a design flow may customize circuit design 114 for implementation in a particular target IC having a particular circuit architecture. As part of circuit design 114, compiler 102 generates hardware memory architecture 116. Hardware memory architecture 116, in general, is a hardware description of a particular memory architecture to be implemented in circuitry. Hardware memory architecture 116 may also be specified using a hardware description language. Hardware memory architecture 116 is derived from modified data structure 112. In one aspect, hardware memory architectural 116 may be specified by, or indirectly indicated by, compiler directive 108. In this regard, compiler 102 is capable of mapping modified data structure 112 onto hardware memory architecture 116.

As defined herein, the term "hardware description language" or "HDL" is a computer-language that facilitates the documentation, design, and manufacturing of a digital system, such as an integrated circuit. An HDL is expressed in human readable form and combines program verification techniques with expert system design methodologies. Using an HDL, for example, a user can design and specify an electronic circuit, describe the operation of the circuit, and create tests to verify operation of the circuit. An HDL includes standard, text-based expressions of the spatial and temporal structure and behavior of the electronic system being modeled. HDL syntax and semantics include explicit notations for expressing concurrency. In contrast to most high-level programming languages, an HDL also includes an explicit notion of time, e.g., clocks and/or clock signals, which is a primary attribute of a digital system. For example, an HDL design may describe the behavior of a circuit design as data transfers occur between registers each clock cycle. Examples of HDLs may include, but are not limited to, Verilog and VHDL. HDLs are sometimes referred to as register transfer level (RTL) descriptions of circuit designs and/or digital systems.

Circuit design 114 may be further processed by one or more other software-based tools that may be executed by HLS system 100 or another data processing system coupled to HLS system 100. The other software-based tools may include one or more Electronic Design Automation (EDA) tools that are operable to realize circuit design 114 as physical circuitry. For example, the EDA tools may further process circuit design 114 through a design flow that includes synthesis, placement, routing, and/or configuration bitstream generation for realization of design 104 and/or circuit design 114 in circuitry. For purposes of illustration and not limitation, the result of the design flow may be one or more configuration bitstream(s) that may be loaded into a programmable integrated circuit to physically implement circuitry that implements the behavior of design 104 therein.

Figure 2:
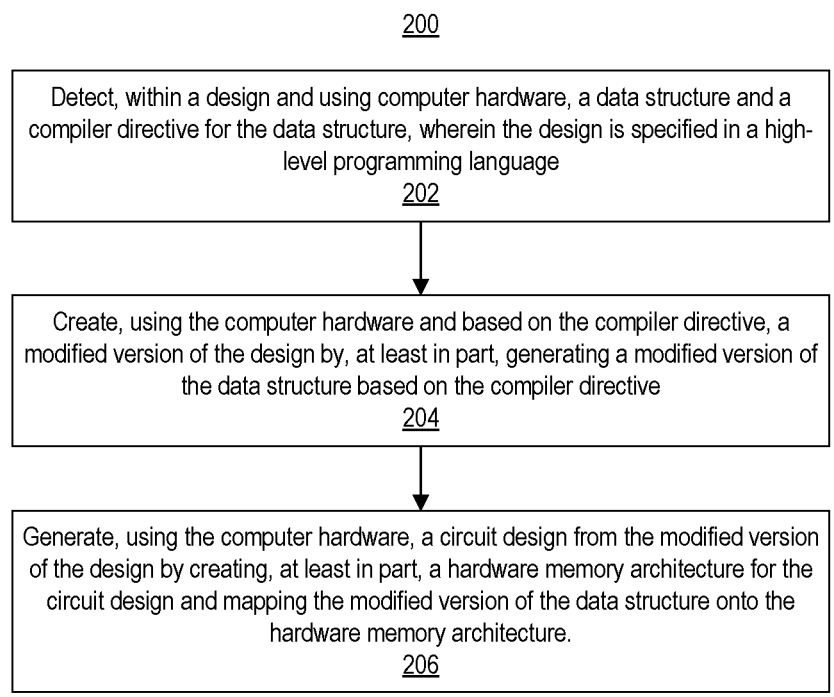
FIG. 2 illustrates an example method of implementing a circuit design from a design specified in a high-level programming language.

FIG. 2 illustrates an example method 200 of creating a circuit design. Method 200 may be performed by HLS system 100 of FIG. 1.

In block 202, HLS system 100 is capable of detecting, within design 104 and using computer hardware, a data structure 106 and a compiler directive 108 for the data structure 106. Design 104 is specified in a high-level programming language. In block 204, HLS system 100 is capable of creating, using the computer hardware and based on compiler directive 108, a modified version of the design (modified design 110) by, at least in part, generating a modified version of the data structure (modified data structure 112) based on the compiler directive.

For example, in block 204, compiler 102 translates design 104 into an intermediate representation. Compiler 102 is capable of annotating compiler directive 108 within the resulting intermediate representation. In one aspect, compiler directive 108 may be an "aggregate" compiler directive. In another aspect, compiler directive 108 may be a "disaggregate" compiler directive. Compiler 102 is capable of annotating compiler directive 108 to indicate the type, e.g., aggregate or disaggregate, and include any other attributes of the compiler directive 108 within the intermediate representation.

In block 206, HLS system 100 is capable of generating, using the computer hardware, a circuit design 114 from modified design 112 by creating, at least in part, a hardware memory architecture 116 for the circuit design 114 and mapping the modified data structure 112 onto the hardware memory architecture 116.

In one or more examples, the data structure includes a struct variable. Within high-level programming languages such as C or C++, the data members of a struct variable may use a data model organization that places the data items together into one contiguous memory space. For example, a struct variable may include multiple fields, with the fields being different in size or length. The data items for the fields may be stored with a data model organization that uses a single, contiguous region of memory. Because of the differing size of the fields of the struct variable, the software memory model introduces redundant padding bits in the data model organization for purposes of alignment and ease of access by a processor.

The example source code of Example 1 illustrates a disaggregate compiler directive. For purposes of illustration, the source code of Example 1 is specified in a high-level programming language such as C++.

Example 1

```
#define N 1024
struct A {
char foo;
int bar;
};
A g[N];
int sum( ){
#pragma HLS disaggregate variable=g
int sum=0;
for (unsigned i=0; i<N; i++)
   sum+=g[i].foo+g [i].bar;
return sum;
}
```

Referring to Example 1, the struct A includes two fields called foo and bar. The field foo is of type char, while the field bar is of type int. In C++, the char type is 1 byte in size (e.g., 8 bits). The int type is 4 bytes in size (32 bits). Example 1 also includes a disaggregate compiler directive denoted by the term "#pragma." In this example, the compiler directive indicates that the array g, which includes elements of struct A, is to be implemented within a circuit design using disaggregation.

As a data structure, referring to array g using elements A (where the element type of A is a struct), data items for foo and bar are stored together with foo data items being padded by 3 bytes. That is, 3 bytes are added to the foo data items so that the fields of the struct A are of the same length. In this example, by adding 3 bytes to the foo data items, both the foo and the bar fields are 4 bytes in length. This type of data model organization may be beneficial where an executable is being generated for execution by a processor.

Figure 3:
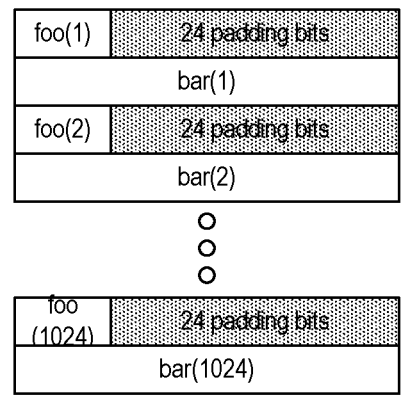
FIG. 3 illustrates an example data structure having a particular data model organization.

FIG. 3 illustrates an example data structure 106 having a particular data model organization. In this example, data structure 106 is of array g having elements of struct A. It should be appreciated that array g may include more data items than shown. Were array g to be implemented in circuitry without the benefit of including the disaggregate compiler directive of Example 1, both of the foo fields and the bar fields would be implemented using a single memory circuit, e.g., a single Block Random Access Memory (BRAM) on the target IC. As may be seen from the example of FIG. 3, a large amount of circuit resources on the target IC may be consumed due to the padding bits added for the char field. That is, a larger portion of the BRAM may be used to store the padding bits.

Figure 4:
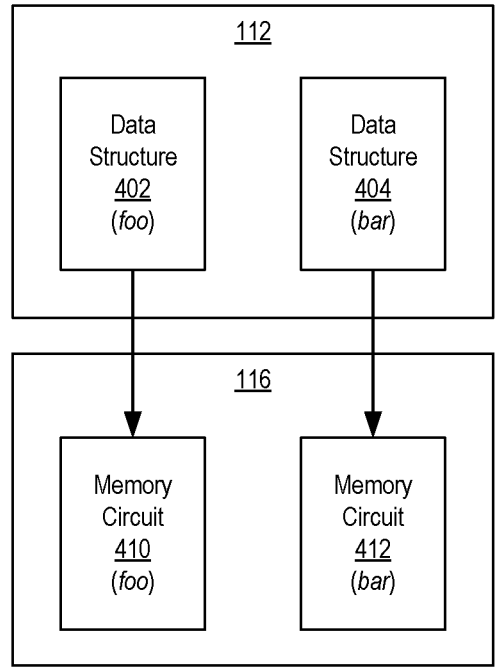
FIG. 4 illustrates an example disaggregation operation performed by the HLS system of FIG. 1.

FIG. 4 illustrates an example disaggregation operation performed by HLS system 100 of FIG. 1. In an aspect, compiler 102 is capable of performing the disaggregation operation as part of block 204 of FIG. 2. That is, compiler 102 may perform the disaggregation operation as part of compiling design 104 in response to detecting compiler directive 108. In executing the disaggregate compiler directive, compiler 102 generates modified data structure 112 by separating the fields of the struct A into multiple different, independent data structures. In one aspect, the disaggregate operation may be performed by compiler 102 as a middle-end optimization pass through modified design 110, e.g., the intermediate representation. In an example implementation, the number of data structures into which data structure 106 is disaggregated may equal the number of fields contained in the struct variable that is included in the array.

Thus, in the example of FIG. 4, in response to detecting and executing the disaggregate compiler directive, compiler 102 has generated modified data structure 112. In this example, modified data structure 112 includes a data structure 402 including only data items corresponding to the foo field and a separate and independent data structure 404 including only data items corresponding to the bar field.

By performing the disaggregation of FIG. 4, the resulting data structures 402 and 404 each may be implemented using a different and independent memory in circuitry (e.g., in the target IC). As shown, data structure 402 may be implemented using a memory circuit 410. Data structure 404 may be implemented using a memory circuit 412. For example, as part of block 206, compiler 102 is capable of generating hardware description language that defines hardware memory architecture 116 including memories 410, 412 and that maps modified data structure 112 onto the hardware memory architecture 116. In this example, mapping means that the data items corresponding to foo are stored in memory circuit 410 while the data items corresponding to bar are stored in memory circuit 412. In an example, memory circuit 410 may be a first BRAM on the target IC and memory circuit 412 a second and different BRAM on the same target IC.

Because the number of data structures into which data structure 106 may be split varies with the number of fields included in the struct variable to be disaggregated, the number of possible hardware memory architectures also varies with the number of fields. In this regard, with respect to a disaggregation compiler directive, compiler 102 selects a hardware memory architecture from a plurality of hardware memory architectures. In one aspect, the memory architecture is selected from a plurality of hardware memory architectures based on the modified version of the data structure. The hardware memory architecture, for example, will include a plurality of memory circuits rather than a single memory circuit. The number of memory circuits further may be based on the number of fields in the data structure or struct variable. Each different hardware memory architecture, for example, may be formed of a different number of memory circuits.

Hardware memory architecture 116 of FIG. 4 provides several benefits compared to using a single memory circuit were the disaggregation compiler directive not included in design 104. For example, each of memories 410, 412 may be configured in the target IC with a width that more closely corresponds to, or matches, that of the underlying fields mapped to the memory. In the example of FIG. 4, memory 410 may have a width of 8 bits while memory 412 may have a width of 32 bits. In this example, compiler 102 does not need to add padding bits so that both fields have a same length. Thus, fewer hardware resources (e.g., less memory and fewer wires accessing memory circuit 410) are needed. In addition, because each field is implemented in a different physical memory circuit, the resulting circuit design is able to access a larger amount of data in parallel, thereby increasing the speed of operation of the resulting circuitry. For example, compared to a non-disaggregated circuit implementation, multiple memory accesses may be assigned on different ones of the memory resources. These memory accesses, being directed to different physical memory resources, may be scheduled on the same clock cycle thereby increasing parallelism.

The example source code of Example 2 illustrates an aggregate compiler directive. For purposes of illustration, the source code of Example 2 is specified in a high-level programming language such as C++.

Example 2

```
#define N 1024
struct A {
char foo;
int bar;
};
A g[N];
int sum( ){
#pragma HLS aggregate variable=g
int sum=0;
for (unsigned i=0; i<N; i++)
   sum+=g[i].foo+g[i].bar;
return sum;
}
```

Example 2 again uses struct A and array g. Example 2 also includes an aggregate compiler directive denoted by the term "#pragma." In this example, the compiler directive indicates that the array g is to be implemented using aggregation.

Compiler 102 is capable of performing the aggregation operation as part of block 204 of FIG. 2. Compiler 102 may generate modified data structure 112 by packing data items (e.g., of the struct of the array) into a single wide word vector. In an aspect, compiler 102 is capable of performing the aggregation operation as part of block 204 of FIG. 2. That is, compiler 102 may perform the aggregation operation as part of compiling design 104 in response to detecting compiler directive 108. In executing the aggregate compiler directive, compiler 102 generates modified data structure 112. In one aspect, the aggregate operation may be performed by compiler 102 as a middle-end optimization pass through modified design 110, e.g., the intermediate representation. As part of the packing operation, compiler 102 optionally may remove redundant padding bits between fields. With redundant padding bits removed, given the 3 bytes of padding bits and array size of 1024, 3k bits of memory may be saved in the circuit design 114.

The aggregate compiler directive may specify one of a variety of different types of aggregation operations based on parameters included in the compiler directive. In one aspect, the aggregation operation may be performed using a "none" option, an "alignment" option, or a "bit" option each corresponding to different aggregation operations. The particular option that is desired may be specified as part of the compiler directive using flags such as "-none," "-alignment," or "-bit" that may be appended to the end of the "#pragma" or using another syntax.

Using the "none" aggregation option, compiler 102 performs aggregation on the array g but does not remove any padding bits. That is, the "none" aggregation option causes compiler 102 to perform only aggregation. The "none" option may be used in cases where data is transferred between the host processor or host computing system and the target IC or a circuit (e.g., a kernel) within the target IC. In that case, the data model organization used in the target IC will be the same as the data model organization in design 104. This option is also useful in cases where the circuit design is simulated using a computer as the memory transfer operations do not require any transformation between the host and the simulated circuit design. Using the "none" option, for example, will result in the creation of hardware memory architecture 116 that stores data in the same format as the computer stores the original data structure (e.g., data structure 106) without modification.

Using the "alignment" option, compiler 102 performs aggregation and also padding removal. Once padding removal is performed, compiler 102 further performs an alignment for the fields of the struct variable. In one aspect, the type of alignment may be specified as a parameter, e.g., a flag, of the compiler directive. In the examples described herein, compiler 102 performs alignment along 1-byte boundaries. In one or more example implementations, 1-byte boundaries may be a default setting for the "alignment" option if another alignment is not included in the aggregate compiler directive.

Figure 5:
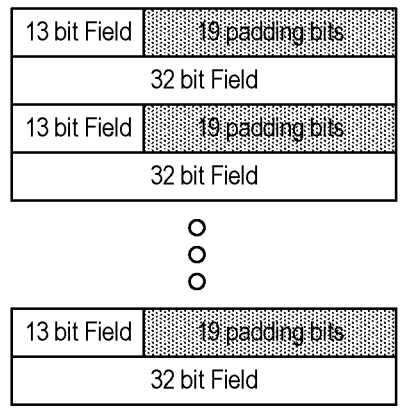
FIG. 5 illustrates another example data structure having a particular data model organization.

FIG. 5 illustrates another example data structure 106 having a particular data model organization. The example of FIG. 5 is used since each field of the struct variable is already aligned along byte boundaries. Consequently, performing an aggregation operation on data structure 106 with the alignment option using 1-byte alignment would result in transformation of the data structure of FIG. 3 to the data structure shown in FIG. 7A.

Referring again to FIG. 5, for purposes of illustration, consider the case where data structure 106 is an array g of struct A, wherein struct A includes a first field that is 13 bits in length (as opposed to 1 byte) and a second field that is 32 bits in length. In other examples, different alignments (e.g., alignments other than one byte) may be specified as a parameter of the aggregate compiler directive.

Figure 6:
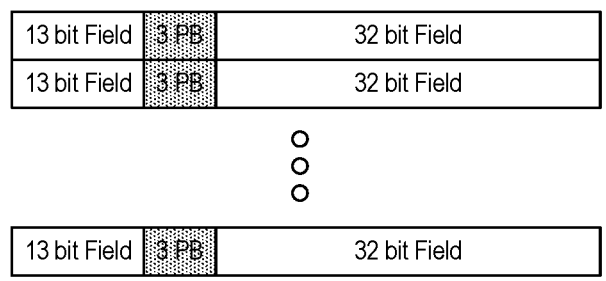
FIG. 6 illustrates an example of another aggregation operation performed by the HLS system of FIG. 1.

FIG. 6 illustrates an example of another aggregation operation performed by the HLS system of FIG. 1. More particularly, FIG. 6 illustrates an example of modified data structure 112 subsequent to compiler 102 performing the data aggregation operation using the "alignment" option using 1 byte alignment on the data structure of FIG. 5. As shown, compiler 102 has removed the 19 padding bits from the 13-bit field shown in FIG. 5 and aligned the 13-bit field to the nearest byte at 16 bits by adding 3 padding bits. The resulting 16-bit field is concatenated with the 32-bit field to form the resulting vectors.

The "alignment" option with 1-byte boundaries may be useful in cases where memory circuits that use byte-enable support (e.g., BRAMs) are used to implement modified data structure 112 in circuitry. Byte-enable refers to a hardware process that allows each field to be written to the hardware (e.g., a BRAM) using the byte-enable function. Without the byte-enable capability, a read-modify-write technique is needed to write individual fields to the physical memory which reduces performance of the resulting circuitry.

Figure 7A:
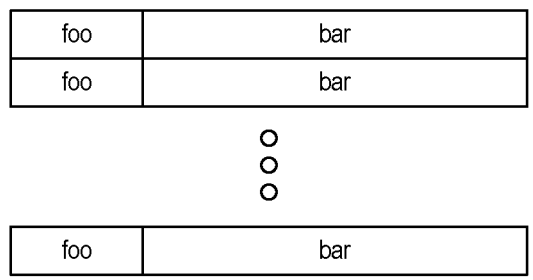
FIGS. 7A and 7B illustrate additional examples of aggregation operations performed by the HLS system of FIG. 1.
Figure 7B:
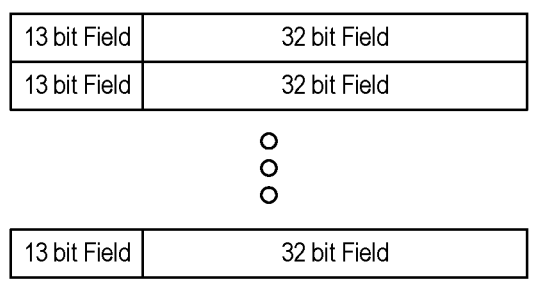

FIGS. 7A and 7B illustrate examples where compiler 102 performs aggregation using the "bit" option. The "bit" option causes compiler 102 to perform aggregation and also padding removal. With the "bit" option, no alignment is performed post padding removal. In the example of FIG. 7A, modified data structure 112 is shown resulting from processing the data structure of FIG. 3. In the example of FIG. 7B, modified data structure 112 is shown resulting from processing the data structure of FIG. 5.

In the examples where aggregation is performed by compiler 102, modified data structure 112 maps onto hardware memory architecture 116 which implements a single memory circuit within circuit design 114. In cases where the compiler directive indicates an aggregation operation, the hardware memory architecture is selected from a plurality of hardware memory architectures based on the modified data structure. For example, the hardware memory architecture is one that implements modified data structure 112 using a single memory circuit rather than one that uses multiple memory circuits as is the case with disaggregation.

Figure 8:
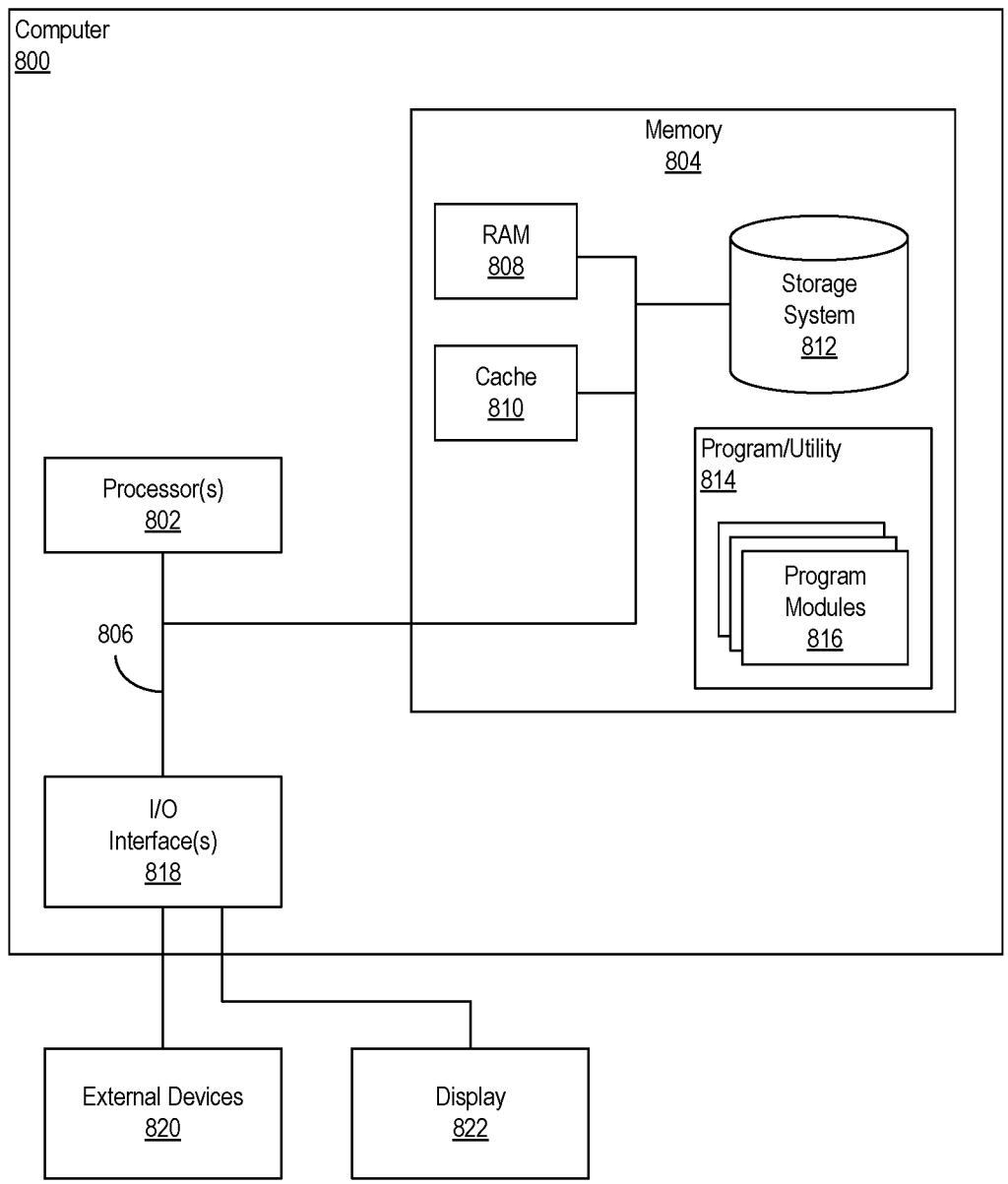
FIG. 8 illustrates an example of a data processing system for implementing the HLS system of FIG. 1.

FIG. 8 illustrates an example implementation of a computer 800. The components of computer 800 can include, but are not limited to, a processor 802, a memory 804, and a bus 806 that couples various system components including memory 804 to processor 802. Processor 802 may be implemented as one or more processors. In an example, processor 802 is implemented as a central processing unit (CPU). Example processor types include, but are not limited to, processors having an x86 type of architecture (IA-32, IA-64, etc.), Power Architecture, ARM processors, and the like.

Bus 806 represents one or more of any of a variety of communication bus structures. By way of example, and not limitation, bus 806 may be implemented as a Peripheral Component Interconnect Express (PCIe) bus. Computer 800 typically includes a variety of computer system readable media. Such media may include computer-readable volatile and non-volatile media and computer-readable removable and non-removable media.

In the example of FIG. 8, computer 800 includes memory 804. Memory 804 can include computer-readable media in the form of volatile memory, such as random-access memory (RAM) 808 and/or cache memory 810. Computer 800 also can include other removable/non-removable, volatile/non-volatile computer storage media. By way of example, storage system 812 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 806 by one or more data media interfaces. Memory 804 is an example of at least one computer program product.

Program/utility 814, having a set (at least one) of program modules 816, may be stored in memory 804. By way of example, program modules 816 may represent an operating system, one or more application programs, other program modules, and program data. Program modules 816 generally carry out the functions and/or methodologies of the example implementations described within this disclosure. For example, one or more of program modules 816 can implement HLS software capable of performing the various operations described within this disclosure upon execution by computer 800.

Program/utility 814 is executable by processor 802. Program/utility 814 and any data items used, generated, and/or operated upon by computer 800 are functional data structures that impart functionality when employed by computer 800.

Computer 800 may include one or more Input/Output (I/O) interfaces 818 communicatively linked to bus 806. I/O interface(s) 818 allow computer 800 to communicate with one or more external devices 820 and/or communicate over one or more networks such as a local area network (LAN), a wide area network (WAN), and/or a public network (e.g., the Internet). Examples of I/O interfaces 818 may include, but are not limited to, network cards, modems, network adapters, hardware controllers, etc. Examples of external devices also may include a display 822 and/or other devices such as a keyboard and/or a pointing device that enable a user to interact with computer 800.

Computer 800 is only one example implementation of a computer. Computer 800 can be practiced as a standalone device (e.g., as a user computing device or a server, as a bare metal server, in a cluster (e.g., two or more interconnected computers), or in a distributed cloud computing environment (e.g., as a cloud computing node) where tasks are performed by remote processing devices that are linked through a communications network. In a distributed cloud computing environment, program modules may be located in both local and remote computer system storage media including memory storage devices. The example of FIG. 8 is not intended to suggest any limitation as to the scope of use or functionality of example implementations described herein. Computer 800 is an example of a data processing system and/or computer hardware that is capable of performing the various operations described within this disclosure.

In this regard, computer 800 may include fewer components than shown or additional components not illustrated in FIG. 8 depending upon the particular type of device and/or system that is implemented. The particular operating system and/or application(s) included may vary according to device and/or system type as may the types of I/O devices included. Further, one or more of the illustrative components may be incorporated into, or otherwise form a portion of, another component. For example, a processor may include at least some memory.

Computer 800 may be operational with numerous other general-purpose or special-purpose computing system environments or configurations. Examples of computing systems, environments, and/or configurations that may be suitable for use with computer 800 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Program modules 816 also may include software that is capable of performing an implementation flow on a circuit design or portion thereof. In this regard, computer 800 serves as an example of one or more EDA tools or a system that is capable of processing circuit designs through a design flow.

Figure 9:
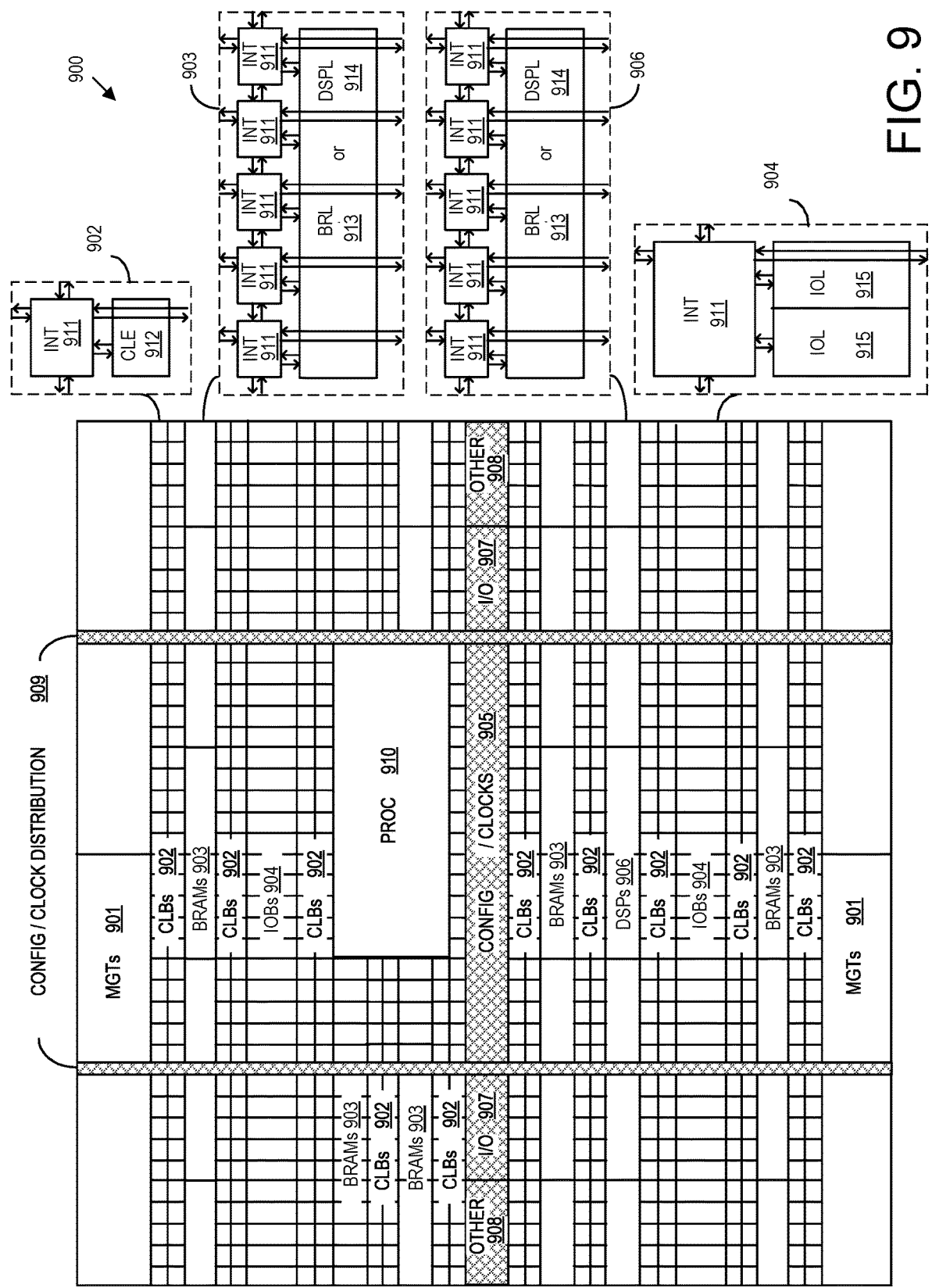
FIG. 9 illustrates an example architecture for an integrated circuit in which a design processed by the HLS system of FIG. 1 may be implemented.

FIG. 9 illustrates an example architecture 900 for an IC. An IC having an architecture as illustrated in FIG. 9 may be used as the target IC in which circuit design 114 of FIG. 1 is implemented. In one aspect, architecture 900 may be implemented within a programmable IC. For example, architecture 900 may be used to implement a field programmable gate array (FPGA). Architecture 900 may also be representative of a system-on-chip (SoC) type of IC. An SoC is an IC that includes a processor that executes program code and one or more other circuits. The other circuits may be implemented as hardwired circuitry, programmable circuitry, and/or a combination thereof. The circuits may operate cooperatively with one another and/or with the processor.

As shown, architecture 900 includes several different types of programmable circuit, e.g., logic, blocks. For example, architecture 900 may include a large number of different programmable tiles including multi-gigabit transceivers (MGTs) 901, configurable logic blocks (CLBs) 902, random access memory blocks (BRAMs) 903, input/output blocks (IOBs) 904, configuration and clocking logic (CONFIG/CLOCKS) 905, digital signal processing blocks (DSPs) 906, specialized I/O blocks 907 (e.g., configuration ports and clock ports), and other programmable logic 908 such as digital clock managers, analog-to-digital converters, system monitoring logic, and so forth.

In some ICs, each programmable tile includes a programmable interconnect element (INT) 911 having standardized connections to and from a corresponding INT 911 in each adjacent tile. Therefore, INTs 911, taken together, implement the programmable interconnect structure for the illustrated IC. Each INT 911 also includes the connections to and from the programmable logic element within the same tile, as shown by the examples included at the right of FIG. 9.

For example, a CLB 902 may include a configurable logic element (CLE) 912 that may be programmed to implement user logic plus a single INT 911. A BRAM 903 may include a BRAM logic element (BRL) 913 in addition to one or more INTs 911. Typically, the number of INTs 911 included in a tile depends on the height of the tile. As pictured, a BRAM tile has the same height as five CLBs, but other numbers (e.g., four) also may be used. A DSP tile 906 may include a DSP logic element (DSPL) 914 in addition to an appropriate number of INTs 911. An IOB 904 may include, for example, two instances of an I/O logic element (IOL) 915 in addition to one instance of an INT 911. The actual I/O pads connected to IOL 915 may not be confined to the area of IOL 915.

In the example pictured in FIG. 9, the shaded area near the center of the die, e.g., formed of regions 905, 907, and 908, may be used for configuration, clock, and other control logic. Shaded areas 909 may be used to distribute the clocks and configuration signals across the breadth of the programmable IC.

Some ICs utilizing the architecture illustrated in FIG. 9 include additional logic blocks that disrupt the regular columnar structure making up a large part of the IC. The additional logic blocks may be programmable blocks and/or dedicated circuitry. For example, a processor block depicted as PROC 910 spans several columns of CLBs and BRAMs.

In one aspect, PROC 910 may be implemented as dedicated circuitry, e.g., as a hardwired processor, that is fabricated as part of the die that implements the programmable circuitry of the IC. PROC 910 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 910 may be omitted from architecture 900 and replaced with one or more of the other varieties of the programmable blocks described. Further, such blocks may be utilized to form a "soft processor" in that the various blocks of programmable circuitry may be used to form a processor that can execute program code as is the case with PROC 910.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 9 that are external to PROC 910 such as CLBs 902 and BRAMs 903 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 910.

In some instances, hardwired circuitry may have one or more operational modes that can be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SoC, the configuration bitstream may specify the circuitry that is to be implemented within the programmable circuitry and the program code that is to be executed by PROC 910 or a soft processor. In some cases, architecture 900 includes a dedicated configuration processor that loads the configuration bitstream to the appropriate configuration memory and/or processor memory. The dedicated configuration processor does not execute user-specified program code. In other cases, architecture 900 may utilize PROC 910 to receive the configuration bitstream, load the configuration bitstream into appropriate configuration memory, and/or extract program code for execution.

FIG. 9 is intended to illustrate an example architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the right of FIG. 9 are purely illustrative. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 910 within the IC are for purposes of illustration only and are not intended as limitations.

A system as described herein in connection with FIGS. 1 and/or 8, for example, is capable of further processing a circuit design having undergone the processing described herein for implementation within an IC having an architecture the same as or similar to that of FIG. 9. The system, for example, is capable of synthesizing, placing, and routing the circuit design. The system may also perform configuration bitstream generation so that the configuration bitstream or configuration data may be loaded into the IC, thereby physically implementing the circuit design within the IC.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

As defined herein, the singular forms "a," "an," and "the" are intended to include the plural forms as well, unless the context clearly indicates otherwise.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without human intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium may be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" may be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, "data processing system" means one or more hardware systems configured to process data, each hardware system including at least one processor programmed to initiate operations and memory.

As defined herein, the term "processor" means at least one circuit capable of carrying out instructions contained in program code. The circuit may be an integrated circuit or embedded in an integrated circuit.

As defined herein, the term "substantially" means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein may be downloaded to respective computing/processing devices from a computer readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions may include state-setting data. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer readable program instructions, e.g., program code.

These computer readable program instructions may be provided to a processor of a computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

What is claimed is:

1. A method, comprising:
   detecting, within a design and using computer hardware, a data structure and a compiler directive for the data structure, wherein the design is specified in a high-level programming language;
   creating, using the computer hardware and based on the compiler directive, a modified version of the design by, at least in part, generating a modified version of the data structure based on the compiler directive; and
   generating, using the computer hardware, a circuit design from the modified version of the design by creating, at least in part, a hardware memory architecture for the circuit design and mapping the modified version of the data structure onto the hardware memory architecture.

2. The method of claim 1, wherein the modified version of the design is an intermediate representation of the design.

3. The method of claim 1, wherein the data structure includes a struct variable.

4. The method of claim 1, wherein the compiler directive indicates a disaggregation operation and the hardware memory architecture is selected from a plurality of hardware memory architectures based on the modified version of the data structure.

5. The method of claim 1, wherein the compiler directive indicates an aggregation operation and the hardware memory architecture is selected from a plurality of hardware memory architectures based on the modified version of the data structure.

6. The method of claim 5, wherein the compiler directive specifies a particular alignment for fields of the data structure performed by the aggregation operation.

7. The method of claim 5, wherein the compiler directive specifies a selected aggregation mode implemented by the aggregation operation, wherein the selected aggregation mode is selected from a plurality of aggregation modes.

8. The method of claim 7, wherein the selected aggregation mode performs only aggregation.

9. The method of claim 7, wherein the selected aggregation mode performs aggregation and padding removal.

10. The method of claim 7, wherein the selected aggregation mode performs aggregation, padding removal, and aligns each field of the data structure to 1-byte boundaries subsequent to the padding removal.

11. A system, comprising:
    a processor configured to initiate operations including:
    detecting, within a design, a data structure and a compiler directive for the data structure, wherein the design is specified in a high-level programming language;
    creating, based on the compiler directive, a modified version of the design by, at least in part, generating a modified version of the data structure based on the compiler directive; and
    generating a circuit design from the modified version of the design by creating, at least in part, a hardware memory architecture for the circuit design and mapping the modified version of the data structure onto the hardware memory architecture.

12. The system of claim 11, wherein the modified version of the design is an intermediate representation of the design.

13. The system of claim 11, wherein the data structure includes a struct variable.

14. The system of claim 11, wherein the compiler directive indicates a disaggregation operation and the hardware memory architecture is selected from a plurality of hardware memory architectures based on the modified version of the data structure.

15. The system of claim 11, wherein the compiler directive indicates an aggregation operation and the hardware memory architecture is selected from a plurality of hardware memory architectures based on the modified version of the data structure.

16. The system of claim 15, wherein the compiler directive specifies a particular alignment for fields of the data structure performed by the aggregation operation.

17. The system of claim 15, wherein the compiler directive specifies a selected aggregation mode implemented by the aggregation operation, wherein the selected aggregation mode is selected from a plurality of aggregation modes.

18. The system of claim 17, wherein the selected aggregation mode performs aggregation and padding removal.

19. The system of claim 17, wherein the selected aggregation mode performs aggregation, padding removal, and aligns each field of the data structure to 1-byte boundaries subsequent to the padding removal.

20. A computer program product, comprising:
    one or more computer readable storage media, and program instructions collectively stored on the one or more computer readable storage media, wherein the program instructions are executable by computer hardware to initiate operations including:
    detecting, within a design, a data structure and a compiler directive for the data structure, wherein the design is specified in a high-level programming language;
    creating, based on the compiler directive, a modified version of the design by, at least in part, generating a modified version of the data structure based on the compiler directive; and
    generating a circuit design from the modified version of the design by creating, at least in part, a hardware memory architecture for the circuit design and mapping the modified version of the data structure onto the hardware memory architecture.

* * * * *